(12) United States Patent
Tran et al.

(10) Patent No.: US 7,656,187 B2
(45) Date of Patent: Feb. 2, 2010

(54) MULTI-CHANNEL COMMUNICATION CIRCUITRY FOR PROGRAMMABLE LOGIC DEVICE INTEGRATED CIRCUITS AND THE LIKE

(75) Inventors: Thungoc Tran, San Jose, CA (US); Sergey Yuryevich Shumarayev, San Leandro, CA (US); Tim Tri Hoang, San Jose, CA (US); Ning Xue, Fremont, CA (US); Chong Lee, San Ramon, CA (US); Ramanand Venkata, San Jose, CA (US)

(73) Assignee: Altera Corporation, San Jose, CA (US)

( * ) Notice: Subject to any disclaimer, the term of this patent is extended or adjusted under 35 U.S.C. 154(b) by 877 days.

(21) Appl. No.: 11/288,810

(22) Filed: Nov. 28, 2005

(65) Prior Publication Data

US 2007/0058618 A1 Mar. 15, 2007

Related U.S. Application Data

(60) Provisional application No. 60/700,843, filed on Jul. 19, 2005, provisional application No. 60/705,536, filed on Aug. 3, 2005.

(51) Int. Cl.
*H03K 19/173* (2006.01)

(52) U.S. Cl. .......................................... 326/38; 326/41

(58) Field of Classification Search ............. 326/37–41, 326/47
See application file for complete search history.

(56) References Cited

U.S. PATENT DOCUMENTS

| | | | | |
|---|---|---|---|---|
| 5,942,914 | A * | 8/1999 | Reddy et al. | 326/41 |
| 6,249,143 | B1 * | 6/2001 | Zaveri et al. | 326/40 |
| 6,392,438 | B1 * | 5/2002 | Cliff et al. | 326/41 |
| 6,650,140 | B2 | 11/2003 | Lee et al. | |
| 6,724,328 | B1 | 4/2004 | Lui et al. | |
| 6,750,675 | B2 | 6/2004 | Venkata et al. | |
| 6,854,044 | B1 | 2/2005 | Venkata et al. | |
| 7,028,270 | B1 | 4/2006 | Lam et al. | |
| 7,131,024 | B1 | 10/2006 | Venkata et al. | |
| 7,227,918 | B2 | 6/2007 | Aung et al. | |
| 7,272,677 | B1 | 9/2007 | Venkata et al. | |
| 7,305,058 | B1 | 12/2007 | Venkata et al. | |
| 7,525,340 | B2 | 4/2009 | Shumarayev et al. | |
| 2007/0047667 | A1 | 3/2007 | Shumarayev et al. | |

* cited by examiner

*Primary Examiner*—James Cho
(74) *Attorney, Agent, or Firm*—Ropes & Gray LLP; Robert R. Jackson

(57) ABSTRACT

An integrated circuit like a programmable logic device ("PLD") includes multiple channels of data communication circuitry. Circuitry is provided for selectively sharing signals (e.g., control-type signals) among these channels in groupings of various size so that the device can better support communication protocols that require various numbers of channels (e.g., one channel operating relatively independently, four channels working together, eight channels working together, etc.). The signals shared may include a clock signal, a FIFO write enable signal, a FIFO read enable signal, or the like. The circuit arrangements are preferably modular (i.e., the same or substantially the same from one channel to the next and/or from one group of channels to the next) to facilitate such things as circuit design and verification.

23 Claims, 5 Drawing Sheets

MULTI-CHANNEL COMMUNICATION CIRCUITRY FOR PROGRAMMABLE LOGIC DEVICE INTEGRATED CIRCUITS AND THE LIKE

This application claims the benefit of U.S. provisional patent application No. 60/700,843, filed Jul. 19, 2005, and U.S. provisional patent application No. 60/705,536, filed Aug. 3, 2005, both of which are hereby incorporated by reference herein in their entireties.

BACKGROUND OF THE INVENTION

This invention relates to multi-channel communication circuitry for integrated circuits such as programmable logic devices ("PLDs"), and more particularly to circuitry for facilitating synchronizing the operation of different numbers of such channels.

References such as Aung et al. U.S. Pat. No. 7,227,918, Lee et al. U.S. Pat. No. 6,650,140, Venkata et al. U.S. Pat. No. 6,750,675, Venkata et al. U.S. Pat. No. 6,854,044, Lui et al. U.S. Pat. No. 6,724,328, Venkata et al. U.S. Pat. No. 7,305,058, Venkata et al. U.S. Pat. No. 7,272,677, Lam et al. U.S. Pat. No. 7,028,270, Venkata et al. U.S. Pat. No. 7,131,024, Shumarayev U.S. patent application publication 2007/0047667, and Shumarayev et al. U.S. Pat. No. 7,525,340, show the inclusion of multi-channel transceiver circuitry on integrated circuits such as PLDs, field-programmable gate arrays ("FPGAs"), and the like. For convenience herein, all integrated circuits to which the invention is or can be applied will generally be referred to as PLDs. This is done only for convenience and is not intended as a limitation.

Different communication protocols require use of different numbers of channels working together. Heretofore, some PLDs provided the channels for such communication in groups of four (so-called quads). Circuitry for allowing various numbers of channels in a quad to be used together was provided in the quad. But if more than four channels were required to work together, then synchronization between the outputs of the quads tended to be a task for circuitry downstream from the quads (e.g., the programmable logic core circuitry of the device).

The interest in multi-channel communication employing more than four channels (e.g., eight channels) continues to increase. This makes it less and less desirable to require use of core logic circuitry for synchronizing the outputs of two (or more) quads that are being used to provide communication links that employ more than four channels. On the other hand, other users of a PLD product may still be interested in using only four or fewer channels in any particular communication link. It would therefore be wasteful to enlarge the quads on a device to include more than four channels (e.g., eight channels). Instead, better ways are needed to allow two (or more) quads to work together when a user wants to implement a communication link employing more than four channels (e.g., eight channels).

In achieving the foregoing, it can be desirable to preserve modularity of the circuitry. By modularity it is meant that two (or more) instances of the circuitry are identical or substantially identical. Modularity facilitates circuit design and verification, and it may even facilitate circuit use (e.g., because timing tends to be uniform from module to module). Modularity may be desirable on a channel basis (i.e., from one channel to the next) and/or a quad basis (i.e., from one quad to the next).

SUMMARY OF THE INVENTION

An integrated circuit in accordance with the invention may include a plurality of channels of data communication circuitry. The channels may be grouped into a plurality of subpluralities of the channels. Signal distribution circuitry is associated with each of the subpluralities that allows a signal to be distributed to the channels in one subplurality or to the channels in two adjacent subpluralities, as desired. Each channel may itself be an alternative source of a signal for use in that channel.

The source of a signal applied to the signal distribution circuitry associated with each subplurality may be one of the channels in that subplurality. Thus, depending on how the distribution circuitry is used, that channel may be the master channel for all the channels in the subplurality, and it may in addition be the master channel for all the channels in the adjacent subplurality.

Examples of signals that may be handled by the distribution circuitry are a clock signal, a write enable signal, a read enable signal, and the like. Either or both of the write and read enable signals may be single-bit signals. Either or both of these signals may be produced only after predetermined numbers of clock signals following a reset release event.

Further features of the invention, its nature and various advantages, will be more apparent from the accompanying drawings and the following detailed description.

DETAILED DESCRIPTION

Figure 1:
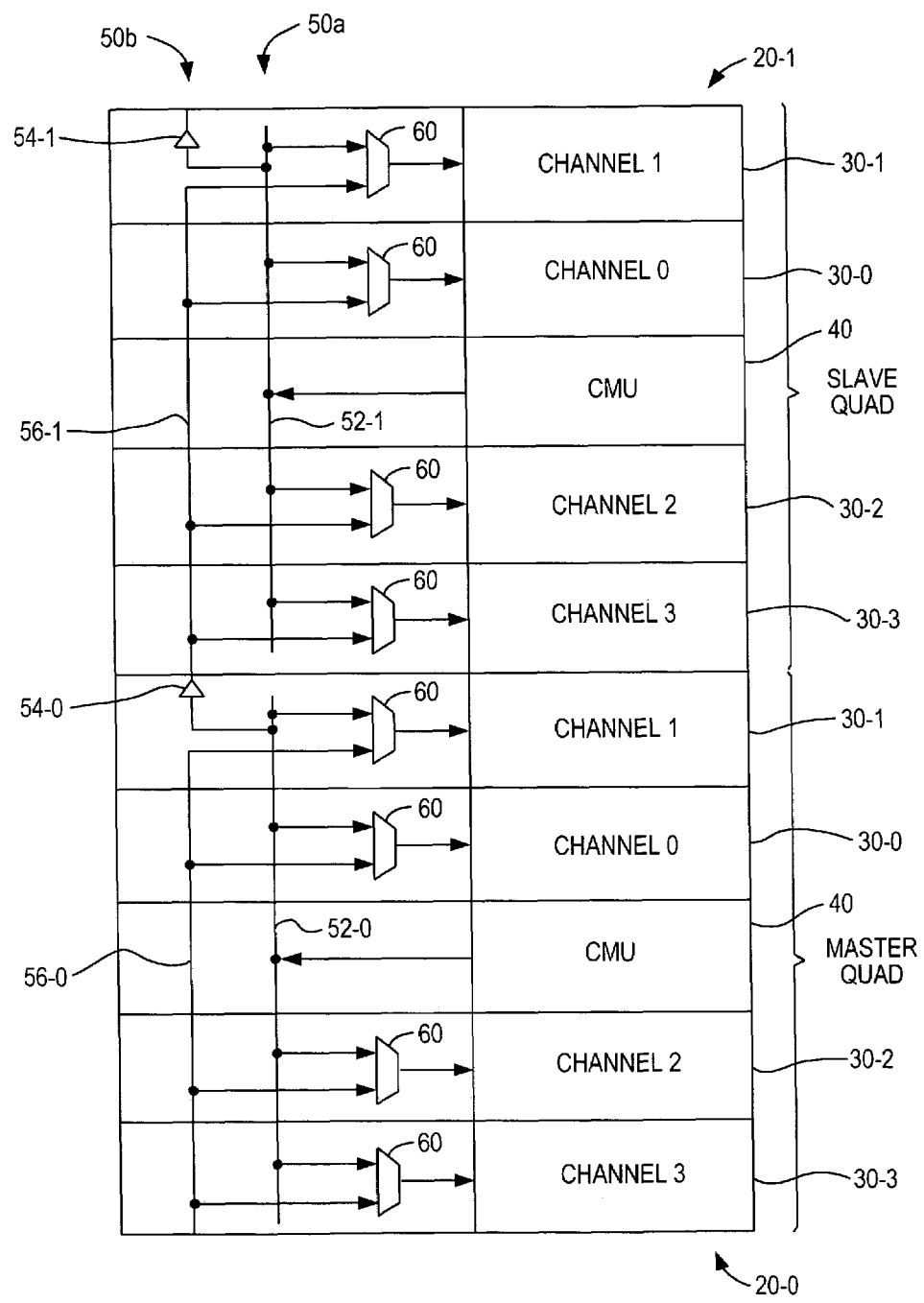
FIG. 1 is a simplified schematic block diagram of an illustrative embodiment of certain possible aspects of the invention.

The possible feature of the invention that is illustrated by FIG. 1 relates to distribution of a type of signal that may be needed either by four (or fewer) communication channels (one quad), or by more than four communication channels (e.g., up to eight channels; two quads). An example of such a signal is a clock signal.

FIG. 1 shows two representative quads 20-0 and 20-1, which are adjacent to one another on a PLD. Quad 20-0 is the master quad and quad 20-1 is the slave quad when quads 20-0 and 20-1 are used together. However, it is not necessary for quads 20-0 and 20-1 to be used together, and either or both can be used independently of the other, in which case there is no master/slave relationship between them.

Each of quads 20 includes four channels 30-0 through 30-3 of data signal communication circuitry. For example, each channel 30 may be so-called high-speed serial interface transceiver circuitry. Such circuitry may be able to receive a serial data input signal, recover the data and a clock signal from that input signal, convert the recovered data to parallel form, and output the parallel data to the core logic circuitry of the PLD. Each channel 30 may also be able to receive parallel data from the core logic circuitry, convert that parallel data to serial form, and output the resulting serial data as a serial data output signal. Each channel 30 may also perform other tasks such as 8-bit/10-bit encoding, 10-bit/8-bit decoding, etc. See the references mentioned earlier in this specification.

Some communication protocols may involve use of only one channel 30. Other communication protocols may involve use of several channels 30. In the latter case there may be "skew" between received data in the several channels, and de-skew of that data (preferably in channels 30) may be necessary for the data to be correctly interpreted. On the transmitter side of multi-channel communication protocols, care must be taken to avoid transmitting the several data output signals with skew between those signals. Requirements such as these can make it important for channels 30 that are working together to share a common clock signal. FIG. 1 shows a circuit arrangement that allows this to be done, either by up to four channels 30 in either quad 20, or by up to eight channels in both quads 20. Moreover, the clock distribution circuitry shown in FIG. 1 can be modular (i.e., it can be the same or substantially the same in both (or all) quads 20).

In addition to the four channels 30 described above, each quad 20 includes clock multiplier (or management) unit ("CMU") circuitry 40. Each CMU 40 can be a source of a clock signal for use by the channels 30 in the quad 20 that includes that CMU. In addition, the CMU 40 in master quad 20-0 can be a source of a clock signal for use by the channels 30 in both of quads 20-0 and 20-1, in the event that more than four channels 30 are required for the communication protocol being implemented.

FIG. 1 shows two parallel conductor tracks 50a and 50b being provided for conductor segments that are used for distribution of clock signals output by CMUs 40. Track 50a has a clock signal distribution conductor segment 52 in it that is associated with each quad 20. In other words, for quad 20-0, track 50a has a conductor segment 52-0 that extends only past the circuit elements 30 and 40 in quad 20-0. Similarly, for quad 20-1, track 50a has a conductor segment 52-1 that extends only past the circuit elements 30 and 40 in quad 20-1. Although axially aligned with one another in the same track 50a, conductor segments 52-0 and 52-1 do not connect to one another. In each quad 20 the associated conductor segment 52 receives a clock signal from the CMU 40 in that quad and distributes that signal to one input terminal of a multiplexer ("mux") 60 associated with each of the channels 30 in that quad.

Near the upper end of each conductor segment 52, that conductor segment is tapped to driver or buffer circuitry 54 that can drive a conductor segment 56 in track 50b in the quad 20 above. Each conductor segment 56 extends past all of the channels 30 in the associated quad 20 and distributes a clock signal on that conductor segment to a second input terminal of the mux 60 associated with each of the channels 30 in that quad.

From the foregoing it will be seen that each quad 20 can have its own clock signal from its own CMU 40 distributed via the associated conductor segment 52. In that case, all muxes 60 will be controlled to select their upper inputs as the source of the clock signal applied to the associated channel 30. Alternatively, if a communication protocol requires more than four channels working together, then the channels 30 in slave quad 20-1 can get their clock signal from the CMU 40 in master quad 20-0. In particular, the clock signal from CMU 40 flows through conductor segment 52-0, buffer 54-0, and conductor segment 56-1. The muxes 60 in master quad 20-0 are controlled to select their upper inputs for application to the channels 30 in the master quad. The muxes 60 in slave quad 20-1 are controlled to select their lower inputs for application to the channels 30 in the slave quad. In this way all channels 30 in both quads can receive the same clock signal from the CMU 40 in master quad 20-0. Moreover, the pattern of elements 52, 54, 56, and 60 can be the same for both (or all) quads 20, making the clock distribution circuitry advantageously modular even though it can operate in either a "by 4" mode (i.e., four channels 30 working together) or a "by 8" mode (i.e., eight channels 30 working together).

It will be appreciated that the arrangement of quads 20 in FIG. 1 can be continued indefinitely above and/or below what is shown in FIG. 1. All such quads can be modular as shown, and any two adjacent quads can be operated in the "by 8" mode as described above.

Figure 2:
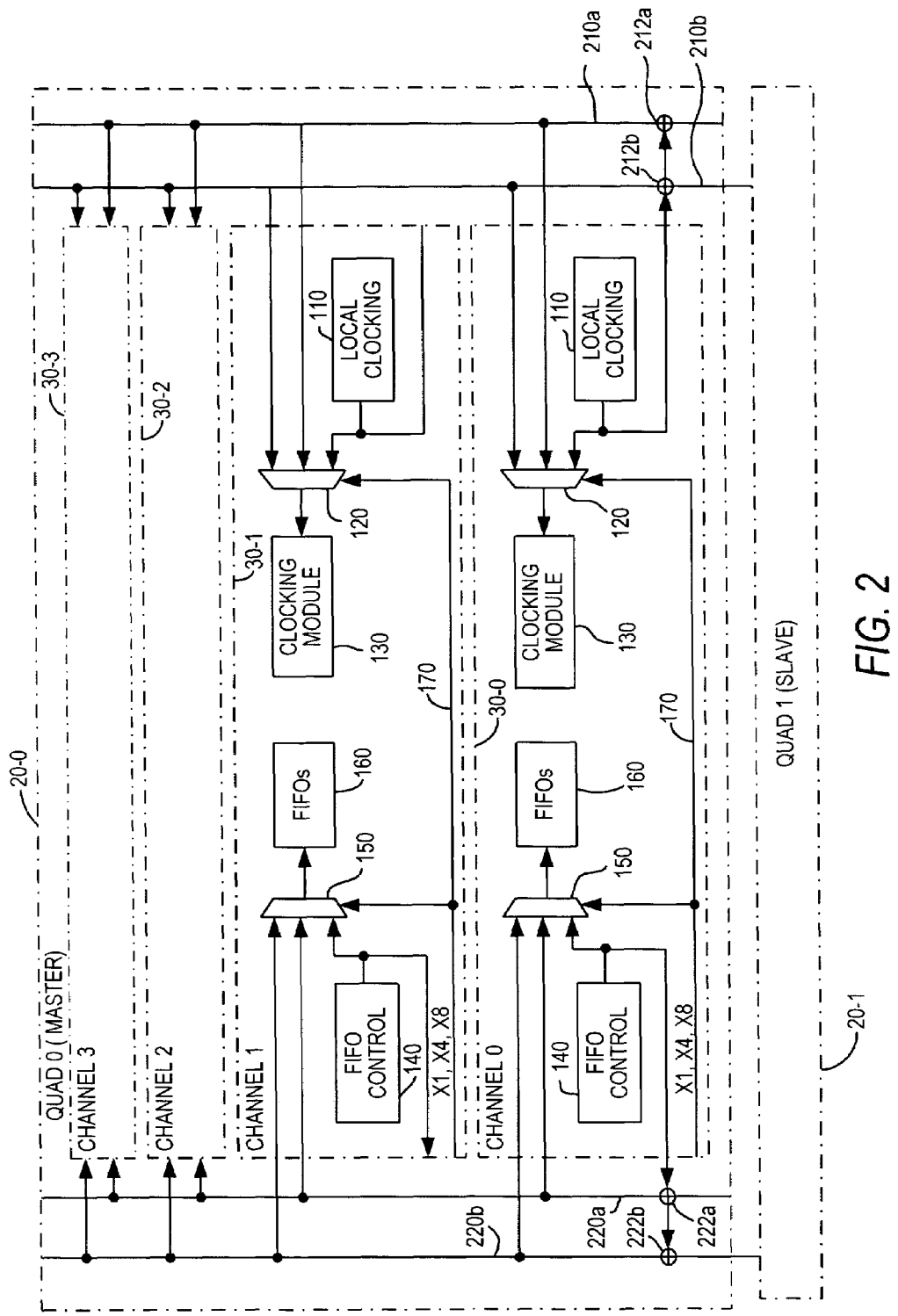
FIG. 2 is a simplified schematic block diagram of an illustrative embodiment of certain other possible aspects of the invention.

Other possible aspects of the invention are illustrated by FIG. 2. (FIG. 2 shows elements arranged differently than in FIG. 1, and omits CMUs 40 to avoid over-crowding the drawing. But both FIGS. relate to similar types of circuitry.) As shown in FIG. 2, each channel 30 may include local clocking circuitry 110, a clock source selection multiplexer ("mux") 120, and clocking module circuitry 130. Each channel 30 may also include FIFO control circuitry 140, FIFO control selection mux circuitry 150, and FIFO circuitry 160. The local clocking circuitry 110 in each channel 30 can produce a final clock signal for use throughout that channel. The clocking module circuitry 130 in each channel 30 performs such functions as dividing the frequency of a serial-bit-rate clock signal to produce a parallel-byte-rate clock signal for use within that channel. The FIFO circuitry 160 in each channel 30 performs such functions as buffering data between the rate and time that the data enters the channel and the rate and time that the data leaves the channel. The FIFO control circuitry 140 in each channel 30 can perform such functions as controlling when the FIFO circuitry 160 in that channel begins to write (accept) data and to read (output) data (e.g., after a reset release).

As shown in FIG. 2, each of channels 30 is capable of a "by 1" ("X1"), "by 4" ("X4"), or "by 8" ("X8") mode of operation. In the X1 mode, each channel 30 operates independently with respect to its final clocking signal (from circuitry 110) and its FIFO controls (from circuitry 140). In the X4 mode as many as four channels 30 in a quad 20 operate together with respect to final clocking and FIFO controls. In the X8 mode as many as eight channels 30 in two adjacent quads 20 operate together with respect to final clocking and FIFO controls.

In the following description of the various possible modes of operating circuitry of the type shown in FIG. 2 (especially the X4 and X8 modes), it will generally be assumed (for simplicity of discussion) that all four channels in a quad are involved in X4 operation of that quad, or that all eight channels in two adjacent quads are involved in X8 operation of those quads. This is not necessarily the case, however, and any channel or channels in a quad operating in X4 or X8 mode can be operated (in X1 mode) independently of the other channels if desired. For example, if a communication protocol requires use of six channels 30, two adjacent quads can be operated in X8 mode to support that protocol, and either or both of the two channels in those quads that are not involved in supporting the X6 protocol can be used independently for other purposes in X1 mode.

In the X1 mode the signals on the leads 170 in a channel 30 cause the muxes 120 and 150 in that channel to select their bottom-most inputs as their outputs. Accordingly, in the X1 mode, the clocking module 130 in a channel 30 gets its clock signal from the local clocking circuitry 110 of that channel. Similarly, the FIFOs 160 in an X1-mode channel 30 get their read enable and write enable signals from the FIFO control circuitry 140 in that channel.

In the X4 mode the channel 30-0 in each quad 20 operating in that mode acts as a master channel for the other channels in that quad. In particular, the output signal of the local clocking circuitry 110 in master channel 30-0 is applied to quad-wide clock signal distribution conductor 210a. The signal on conductor 210a is applied to the middle input of the mux 120 in each channel 30 in the quad. All of muxes 120 in the quad are controlled by X4-valued signals on the associated conductors 170 to select their middle inputs as the source of the clock signal applied to the associated clocking module circuitry 130. In this way all of the modules 30 in a quad 20 operating in X4 mode operate on the same clock signal, i.e., the clock signal from the local clocking circuitry 110 of the master channel 30-0 in that quad. This helps eliminate or at least substantially reduce clock skew between the channels 30 of a quad 20 operating in X4 mode.

In addition to supplying a master clock signal for all channels 30 in a quad 20 operating in X4 mode, the master channel 30-0 in such a quad supplies master write enable and read enable signals for all channels in the quad. The write enable and read enable output signals of the FIFO control circuitry 140 in master channel 30-0 are applied to quad-wide write and read enable signal distribution conductors 220a. From conductors 220a these signals are applied to the middle inputs of the muxes 150 in all of the channels 30 in the quad. The X4-valued signals on the leads 170 in each channel cause all of muxes 150 to select their middle inputs as the source of the mux output signals that are applied to the associated FIFOs 160. Accordingly, in a quad 20 operating in X4 mode, all of the FIFOs 160 in that quad receive the same write enable and read enable signals from the same source (the FIFO control circuitry 140 of the associated master channel 30-0) at substantially the same time. This helps ensure that all channels 30 in a quad 20 operating in X4 mode will respond properly to a reset release event. In particular, all channels will begin to write and read at a desired time after a reset release event. Problems that might otherwise be caused by a reset release signal reaching the various channels 30 in a quad at different times are avoided by having only master channel 30-0 respond to such a signal and produce master write enable and read enable signals for itself and all other channels in the quad operating in X4 mode.

Turning now to X8 mode, clock distribution conductor 210b extends past all the channels 30 in two adjacent quads 20-0 and 20-1. Similarly, write and read enable signal distribution conductors 220b extend past all the channels in the two adjacent quads. These conductors 210b and 220b can also receive from the master channel 30-0 in master quad 20-0 the same signals that can be applied to the conductors 210a and 220a in quad 20-0. Accordingly, conductors 210b and 220b are used in X8 mode operation of quads 20-0 and 20-1.

The signal on conductor 210b is applied to the top-most input to the mux 120 in all of the channels 30 in quads 20-0 and 20-1. In X8 mode the X8-valued signals on the leads 170 in all of the channels 30 in both quads 20-0 and 20-1 cause the muxes 120 in those eight channels to select their top-most input for application to the associated clocking module circuitry 130. Accordingly, all eight channels 30 in quads 20-0 and 20-1 operate on the same clock signal (from the local clocking circuitry 110 in the master channel 30-0 in master quad 20-0). Because all eight channels are operating on the same clock signal from the same source, clock signal skew among the channels in eliminated or at least greatly reduced. (For complete clarity, it is noted that in this embodiment the output signal of the local clocking circuitry 110 in the master channel 30-0 in slave quad 20-1 is not applied to conductor 210b. The circuitry can be the same in both quads, but the connections 212a and 212b from local clocking circuitry 110 to conductors 210a and 210b can be controllable (e.g., programmable). In this way only the output signal of 110 in 30-0 in 20-0 is connected to 210b, and there is no signal contention because 110 in 30-0 in 20-1 is not connected to 210b.)

The write enable and read enable output signals of FIFO control circuitry 140 in the master channel 30-0 in master quad 20-0 are handled in very much the same way in X8 mode. These signals are applied to conductors 220b, which connect to the top-most inputs of the muxes 150 in all eight of the channels 30 in quads 20-0 and 20-1. The X8-valued signals on the leads 170 in all eight channels cause all eight muxes 150 to select their top-most inputs for application to the associated FIFOs 160. Accordingly, all eight channels operate on the write enable and read enable signals from a single source 140 in the master channel 30-0 in master quad 20-0. (Again, the connections 222a and 222b from each master channel 30-0 source to conductors 220a and 220b can be made controllable (e.g., programmable) so that the circuitry of the two quads can be modular but without producing signal contention on conductors 220b. Such contention is avoided by only enabling 222b associated with quad 20-0, and not enabling 222b associated with quad 20-1.)

Again it is pointed out that, although the description above does not generally mention it, a channel 30 in an X4-mode quad or pair of X8-mode quads that is not actually needed for the otherwise X4 or X8 operation of that quad or pair of quads can be operated independently in X1 mode for another purpose if desired.

A possible further feature of the invention as illustrated by FIG. 2 is the use of a single-bit write enable signal and/or a single-bit read enable signal from sources 140 to destination 160. This conserves conductor resources 220 and promotes more instantaneous recognition by destinations 160 as to when writing and reading should begin.

Another possible feature of the invention as illustrated by FIG. 2 is having the master channel 30-0 wait a certain number of clock cycles after a reset release before issuing write enable and/or read enable signals. This helps ensure that all channels (especially the slave channels) are ready to be released and to operate when the first rising edge of the write enable signal and the first rising edge of the read enable signal arrive at the slave channels. This in turn ensures that all channels start writing/reading at the same clock cycle and always point to the same FIFO address.

Figure 3:
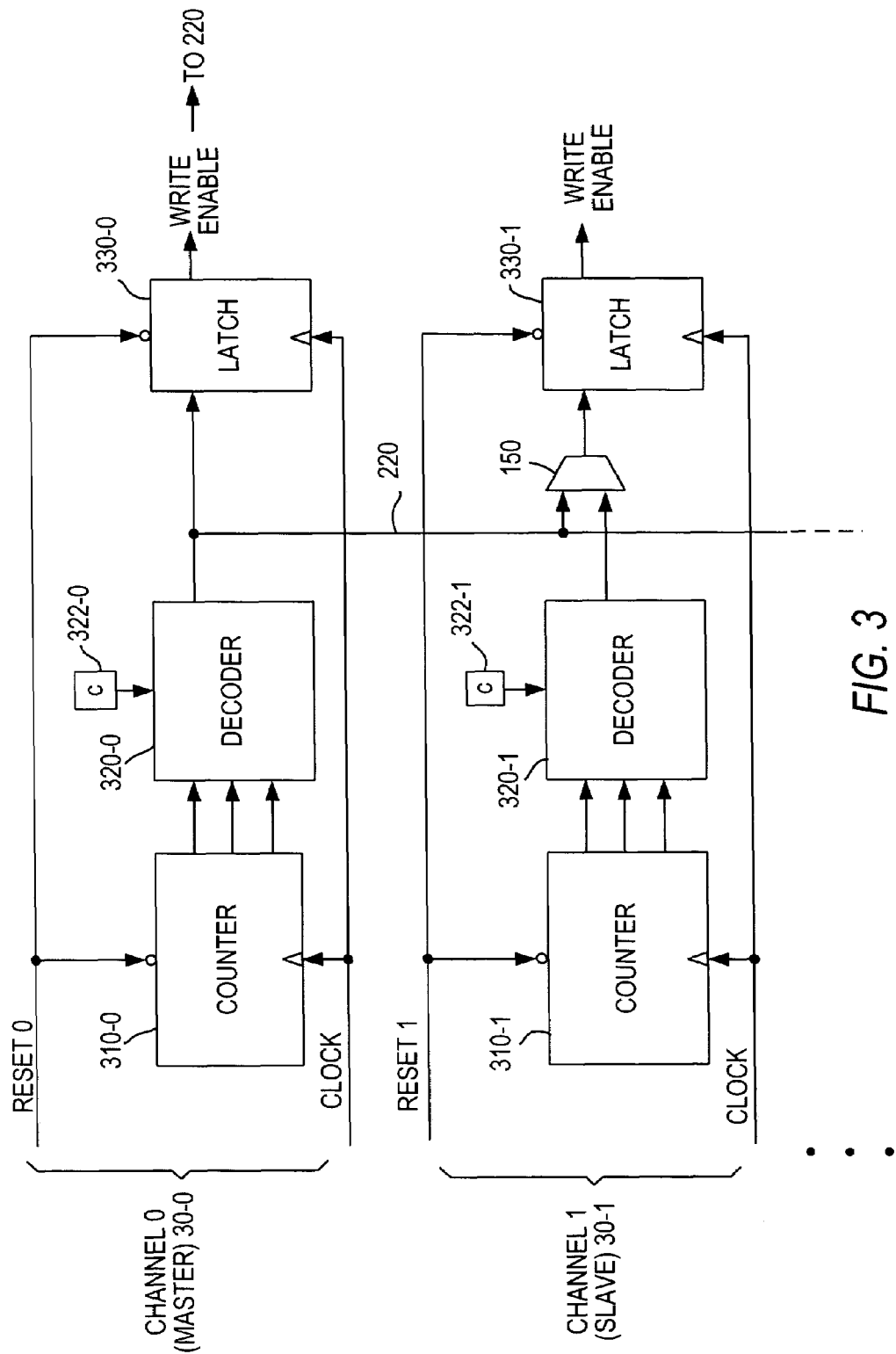
FIG. 3 is a simplified schematic block diagram of an illustrative embodiment of circuitry for implementing a further possible feature of what is illustrated by FIG. 2 in accordance with the invention.

Illustrative circuitry for implementing the feature mentioned in the preceding paragraph is shown in FIG. 3 and can be part of appropriate FIFO control circuitry 140. In the illustrative embodiment shown in FIG. 3 the FIFO control circuitry in each channel 30 includes counter circuitry 310, decoder circuitry 320, and latch circuitry 330. The counter 310 and latch 330 in each channel are reset by a reset signal applied to that channel. After a reset release event, each counter 310 begins to count cycles of a clock signal applied to that channel. The count-indicating output signals of each counter 310 are applied to the associated decoder 320. When the count-indicating output signals applied to a decoder reach a threshold value established by that decoder, the decoder outputs a signal that can be latched into the associated latch 330 by the associated clock signal. Thereafter, the latch 330 outputs a write enable signal until the latch is again reset by the associated reset signal.

In X1 mode each channel 30 operates independently in the respects described in the preceding paragraph. This means that the mux 150 in each channel selects the output of the associated ("local") decoder 320 for application to the associated latch 330. In X4 or X8 mode all channels 30 that are working together get their latch 330 input from the same source, i.e., the output of the decoder 320 in master channel 30-0. This is accomplished by having the mux 150 in each slave channel 30-1, etc., get its output from an upper mux input. In this way all of the channels that are working together have synchronized write enable signals.

Each circuitry 322 may supply the threshold value used by the associated decoder 320. Each circuitry 322 may be programmable so that the threshold value can be set to any desired value.

The same arrangement that is shown in FIG. 3 can be used (duplicated or supplemented) to produce read enable signals having similar characteristics to those described for the write enable signals in FIG. 3. The only difference would be to change the labels "write enable" in FIG. 3 to "read enable."

Figure 4:
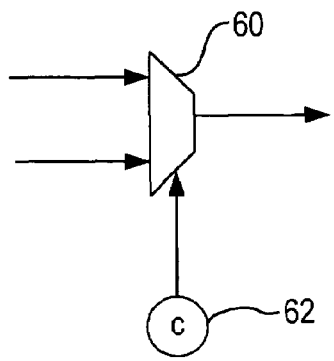
FIG. 4 is a simplified schematic block diagram of an illustrative embodiment of a representative portion of circuitry of the type shown in FIG. 1 in accordance with the invention.

FIG. 4 shows that each of muxes 60 in FIG. 1 can be controlled (to select which of its inputs to output) by circuitry 62, which can be programmable. The same type of control can be used for other muxes like 120 and 150.

Figure 5:
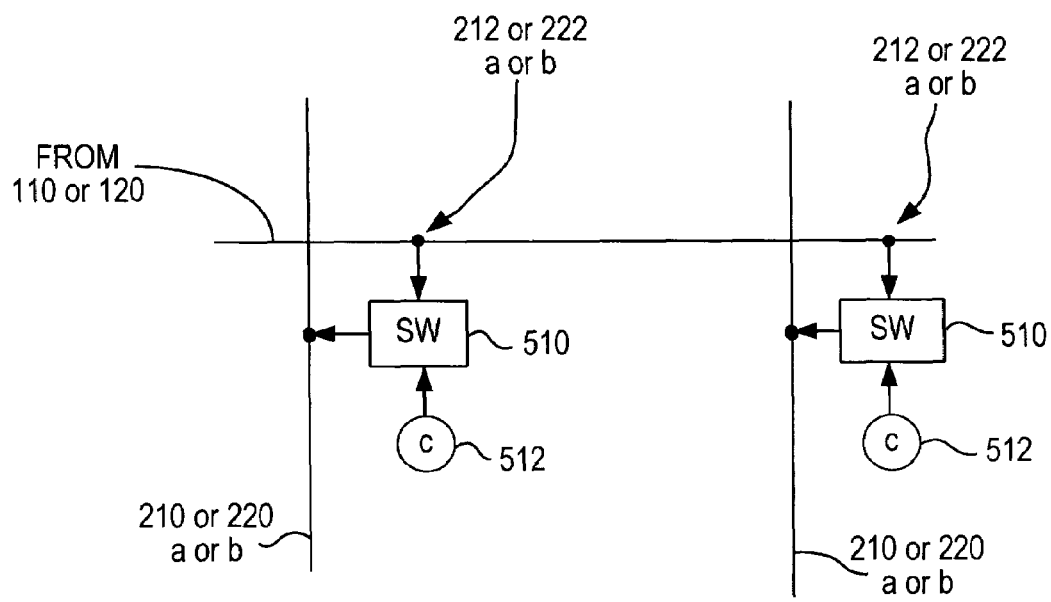
FIG. 5 is a simplified schematic block diagram of an illustrative embodiment of a representative portion of circuitry of the type shown in FIG. 2 in accordance with the invention.

FIG. 5 shows an illustrative implementation of connections like 212 and 222 in FIG. 2. Each such connection can include a switch 510 (e.g., a transistor) for selectively connecting the horizontal conductor to the associated vertical conductor. Each switch 510 is turned on or off by associated control circuitry 512, which can be programmable.

Figure 6:
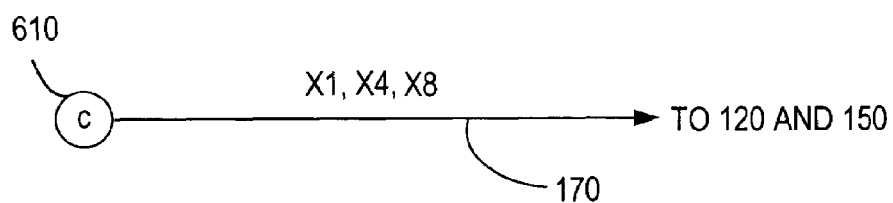
FIG. 6 is a simplified schematic block diagram of an illustrative embodiment of another representative portion of circuitry of the type shown in FIG. 2 in accordance with the invention.

FIG. 6 shows that the source of the signals on conductors 170 can be control circuitry 610, which can be programmable.

Elements described above as programmable can be implemented in any of many different possible ways, such as by configuration random access memory ("CRAM") cells on the integrated circuit that includes the other circuitry.

Figure 7:
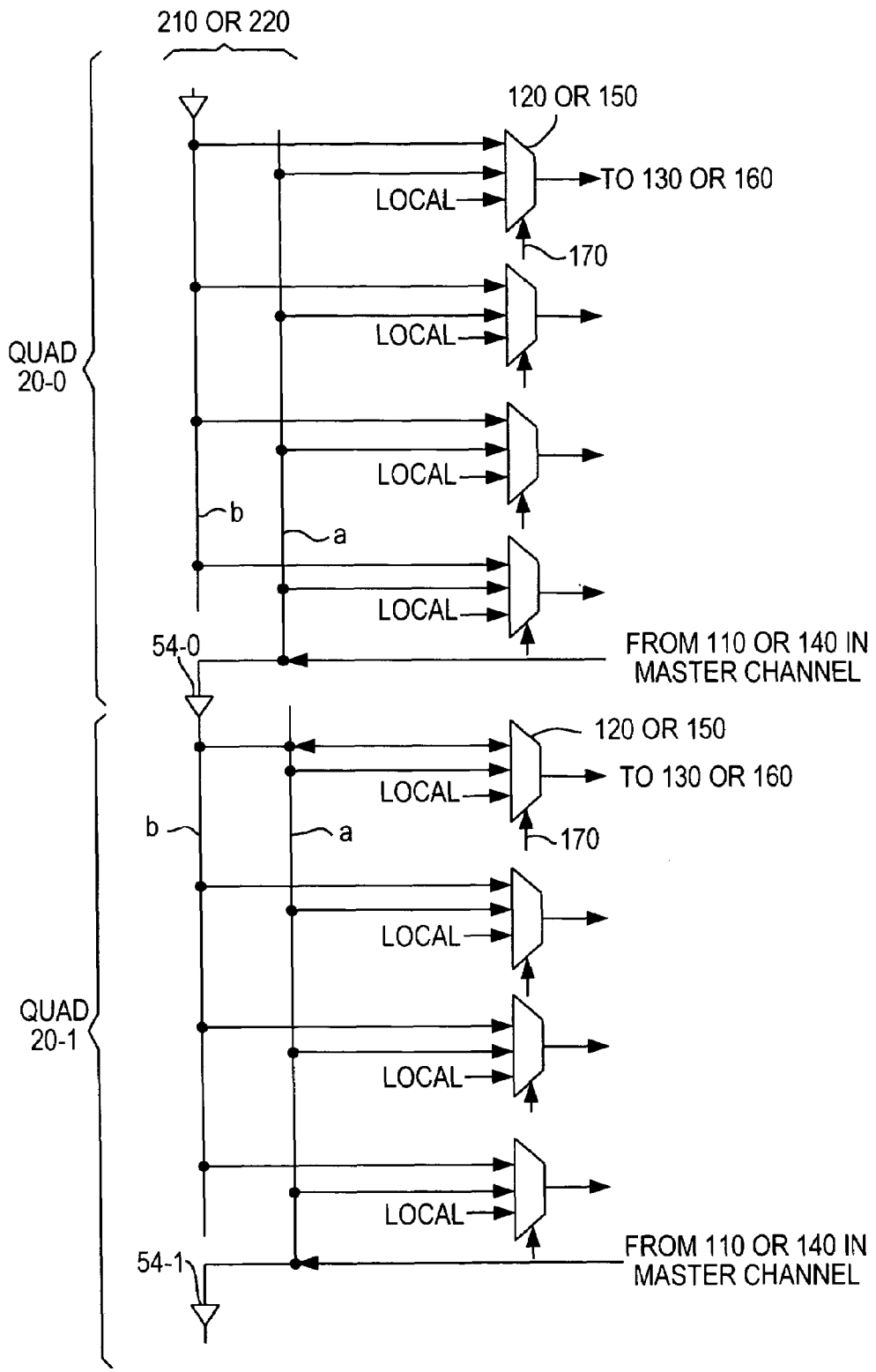
FIG. 7 is a simplified schematic block diagram illustrating how principles of the type shown in FIG. 1 may be applied to features of the type shown in FIG. 2 in accordance with the invention.

FIG. 7 illustrates how principles like those shown in FIG. 1 can be applied to features like those shown in FIG. 2. In FIG. 7 a signal from the circuitry 110 or 140 in the master channel 30-0 (FIG. 2) of each quad 20 is applied to an "a" conductor segment associated with that quad. Such an "a" conductor segment can be either of type 210 or type 220 in FIG. 2. An "a" conductor segment extends past the four channels in the quad 20 associated with that conductor segment, but it does not extend (in the same conductor track) to adjacent quads 20. The "a" conductor segment has a connection to the middle input of the mux 120 or 150 in each channel of the associated quad 20. Near the bottom of each quad 20 the "a" conductor segment associated with that quad has a connection through a buffer 54 to a "b" conductor segment in another track and associated with the quad below. Each "b" conductor segment extends past the four channels in the quad 20 associated with that conductor segment, but it does not extend (in the same conductor track) to adjacent quads 20. Each "b" conductor segment has a connection to the top-most input of the mux 120 or 150 in each channel of the associated quad 20.

X1 operation of circuitry constructed as shown in FIG. 7 is the same as described above for FIG. 2.

Either or both of the representative quads 20 shown in FIG. 7 can be operated in X4 mode by controlling the muxes 120 or 150 in the channels of an X4-mode quad to select the signal on the associated "a" conductor segment. The "b" conductor signal is ignored in any quad that is operating in X4 mode.

The representative quads 20 shown in FIG. 7 can be operated together in X8 mode as follows. In master quad 20-0 muxes 120 or 150 are controlled to select the signal on the associated "a" conductor segment. In slave quad 20-1 muxes 120 or 150 are controlled to select the signal on the associated "b" conductor segment. It will be clear from FIG. 7 and what has already been said that the signal on the "a" conductor segment in quad 20-0 is the same as the signal on the "b" conductor segment in quad 20-1, thereby achieving the desired X8 operation of the two quads. Moreover, as in FIG. 2, the source of this X8-mode master signal is the circuitry 110 or 140 in the master channel 30-0 in master quad 20-0. This is again the same as the source of the X8-mode master signal in FIG. 2.

As in the case of FIG. 2, any channel 30 in FIG. 7 that is not actually needed in X4 or X8 operation of a quad or quad pair can be operated independently in X1 mode for another purpose, if that is desired.

It will be noted that (like FIG. 1) the embodiment shown in FIG. 7 can be modular across any number of adjacent quads 20. Moreover, any two adjacent quads in such an extended array can be operated together in X8 mode. The arrangement shown in FIG. 7 can be used for any or all of the output signals of master channel elements 110 and 140 in FIG. 2. As many instances of what is shown in FIG. 7 are replicated and employed as are required to support handling of the desired number of signals.

It will be understood that the foregoing is only illustrative of the principles of the invention, and that various modifications can be made by those skilled in the art without departing from the scope and spirit of the invention. For example, the number of various types of circuit elements employed in the embodiments shown and described is only illustrative, and other (larger or smaller) numbers of various elements can be used instead if desired. As just one specific example of this, a quad 20 of four channels 30 can instead be a group, block, or subplurality 20 of some other (plural) number of channels 30. The particular geometric arrangements shown herein are also only illustrative and can be altered if desired. For example, other arrangements of quads 20 (e.g., horizontal rows instead of vertical columns) are equally possible. The location of the master channel 30-0 in a quad is arbitrary (although it can be advantageous, from the standpoint of reduced X8 mode skew, for the master channel 30-0 to be near the slave quad that will get its X8 master signal from that master channel). The relative locations of master and slave quads 20 in X8 mode is arbitrary.

The invention claimed is:

1. An integrated circuit comprising:
   a plurality of channels of data communication circuitry, the channels being grouped into a plurality of subpluralities of the channels;
   first and second signal distribution conductors associated with each of the subpluralities and extending adjacent all of the channels in the associated subplurality;

circuitry for connecting the first conductor associated with each subplurality to the second conductor of an adjacent subplurality; and circuitry for allowing each channel in each subplurality to obtain a signal from either the first or second conductor associated with that subplurality, wherein the circuitry for connecting comprises buffer circuitry.

2. The integrated circuit defined in claim 1 wherein each first conductor extends only adjacent the channels in the associated subplurality.

3. The integrated circuit defined in claim 2 wherein each second conductor extends only adjacent the channels in the associated subplurality.

4. The integrated circuit defined in claim 1 wherein the first conductors are separate conductor segments in a first conductor track that extends adjacent all of the channels in the plurality, and wherein the second conductors are separate conductor segments in a second conductor track that extends adjacent all of the channels in the plurality.

5. The integrated circuit defined in claim 1 further comprising:

signal source circuitry associated with each of the subpluralities for applying a signal to the first conductor associated with that subplurality.

6. The integrated circuit defined in claim 5 wherein the signal source circuitry is in addition to the channels in the associated subplurality.

7. The integrated circuit defined in claim 5 wherein the signal source circuitry is circuitry in one of the channels in the associated subplurality.

8. The integrated circuit defined in claim 5 wherein the signal source circuitry comprises clock signal source circuitry.

9. The integrated circuit defined in claim 5 wherein the signal source circuitry comprises write enable signal source circuitry.

10. The integrated circuit defined in claim 9 wherein the write enable signal source circuitry comprises circuitry for producing a write enable signal a predetermined number of cycles of a clock signal after a reset release event.

11. The integrated circuit defined in claim 5 wherein the signal source circuitry comprises read enable signal source circuitry.

12. The integrated circuit defined in claim 11 wherein the read enable signal source circuitry comprises circuitry for producing a read enable signal a predetermined number of cycles of a clock signal after a reset release event.

13. The integrated circuit defined in claim 1 wherein the circuitry for allowing additionally allows each channel to alternatively obtain the signal from circuitry of that channel.

14. An integrated circuit comprising:

a plurality of channels of data communication circuitry, the channels being grouped into a plurality of subpluralities of the channels;

a first signal distribution conductor associated with each of the subpluralities and extending adjacent all of the channels in the associated subplurality;

a second signal distribution conductor associated with a pair of adjacent subpluralities and extending adjacent all of the channels in the associated pair;

signal source circuitry associated with each of the subpluralities for selectively applying a signal to the first and second conductors associated with that subplurality; and circuitry for allowing each channel in each subplurality to obtain a signal from either the first or second conductor associated with that subplurality, wherein the signal source circuitry associated with each of the subpluralities is circuitry in one of the channels in the associated subplurality.

15. The integrated circuit defined in claim 14 wherein the circuitry for allowing additionally allows each channel to alternatively obtain the signal from circuitry of that channel.

16. An integrated circuit comprising:

a plurality of channels of data communication circuitry, the channels being grouped into a plurality of subpluralities of the channels;

first and second conductor tracks extending adjacent to all of the channels;

a plurality of separate first conductor segments in the first track, each of those segments extending adjacent to all of the channels in a respective one of the subpluralities;

a plurality of separate second conductor segments in the second track, each of those segments extending adjacent to all of the channels in a respective one of the subpluralities;

connection circuitry associated with each of the subpluralities for connection of the first conductor segment associated with that subplurality to the second conductor segment associated with an adjacent subplurality; and circuitry for allowing each of the channels in each of the subpluralities to obtain a signal from either the first or second conductor segment associated with that subplurality.

17. The integrated circuit defined in claim 16 wherein each of the subpluralities includes signal source circuitry for applying a signal to the first conductor segment associated with that subplurality.

18. The integrated circuit defined in claim 17 wherein the signal source circuitry associated with each of the subpluralities is circuitry in one of the channels in the associated subplurality.

19. The integrated circuit defined in claim 16 wherein the circuitry for allowing additionally allows each channel to alternatively obtain the signal from circuitry of that channel.

20. An integrated circuit comprising:

a plurality of channels of data communication circuitry, the channels being grouped into a plurality of subpluralities of the channels;

first and second signal distribution conductors associated with each of the subpluralities and extending adjacent all of the channels in the associated subplurality;

circuitry for connecting the first conductor associated with each subplurality to the second conductor of an adjacent subplurality;

circuitry for allowing each channel in each subplurality to obtain a signal from either the first or second conductor associated with that subplurality; and signal source circuitry associated with each of the subpluralities for applying a signal to the first conductor associated with that subplurality, wherein the signal source circuitry is circuitry in one of the channels in the associated subplurality.

21. An integrated circuit comprising:

a plurality of channels of data communication circuitry, the channels being grouped into a plurality of subpluralities of the channels;

first and second signal distribution conductors associated with each of the subpluralities and extending adjacent all of the channels in the associated subplurality;

circuitry for connecting the first conductor associated with each subplurality to the second conductor of an adjacent subplurality;

circuitry for allowing each channel in each subplurality to obtain a signal from either the first or second conductor associated with that subplurality; and signal source circuitry associated with each of the subpluralities for applying a signal to the first conductor associated with that subplurality, wherein the signal source circuitry comprises clock signal source circuitry.

22. An integrated circuit comprising:

a plurality of channels of data communication circuitry, the channels being grouped into a plurality of subpluralities of the channels;

first and second signal distribution conductors associated with each of the subpluralities and extending adjacent all of the channels in the associated subplurality;

circuitry for connecting the first conductor associated with each subplurality to the second conductor of an adjacent subplurality;

circuitry for allowing each channel in each subplurality to obtain a signal from either the first or second conductor associated with that subplurality; and signal source circuitry associated with each of the subpluralities for applying a signal to the first conductor associated with that subplurality, wherein the signal source circuitry comprises write enable signal source circuitry.

23. An integrated circuit comprising:

a plurality of channels of data communication circuitry, the channels being grouped into a plurality of subpluralities of the channels;

first and second signal distribution conductors associated with each of the subpluralities and extending adjacent all of the channels in the associated subplurality;

circuitry for connecting the first conductor associated with each subplurality to the second conductor of an adjacent subplurality;

circuitry for allowing each channel in each subplurality to obtain a signal from either the first or second conductor associated with that subplurality; and signal source circuitry associated with each of the subpluralities for applying a signal to the first conductor associated with that subplurality, wherein the signal source circuitry comprises read enable signal source circuitry.

* * * * *

UNITED STATES PATENT AND TRADEMARK OFFICE
CERTIFICATE OF CORRECTION

PATENT NO. : 7,656,187 B2 Page 1 of 1
APPLICATION NO. : 11/288810
DATED : February 2, 2010
INVENTOR(S) : Tran et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1101 days.

Signed and Sealed this

Twenty-eighth Day of December, 2010

David J. Kappos
*Director of the United States Patent and Trademark Office*